United States Patent
Maeda et al.

(10) Patent No.: US 7,734,263 B2
(45) Date of Patent: Jun. 8, 2010

(54) TRANSMISSION CIRCUIT AND COMMUNICATION DEVICE

(75) Inventors: Masakatsu Maeda, Kyoto (JP); Taichi Ikedo, Kanagawa (JP)

(73) Assignee: Panasonic Corporation, Osaka (JP)

( * ) Notice: Subject to any disclaimer, the term of this patent is extended or adjusted under 35 U.S.C. 154(b) by 490 days.

(21) Appl. No.: 11/812,730

(22) Filed: Jun. 21, 2007

(65) Prior Publication Data

US 2007/0297530 A1    Dec. 27, 2007

(30) Foreign Application Priority Data

Jun. 23, 2006  (JP) .............................. 2006-174558

(51) Int. Cl.
*H01Q 11/12* (2006.01)
(52) U.S. Cl. ...................... 455/127.1; 455/91; 455/95; 455/127.2; 455/108; 455/110; 455/114.3; 375/300; 375/302; 375/295; 375/296; 375/297; 330/149; 330/135; 330/125; 330/136; 330/254
(58) Field of Classification Search ............... 455/91, 455/95, 127.1, 127.2, 108, 110, 114.3; 375/300, 375/302, 295–297; 330/149, 135, 125, 136, 330/10, 254
See application file for complete search history.

(56) References Cited

U.S. PATENT DOCUMENTS

2004/0240583 A1* 12/2004 Rauh et al. ................. 375/297
2005/0254597 A1* 11/2005 Bright ........................ 375/300
2006/0009169 A1    1/2006 Arayashiki
2006/0068697 A1*  3/2006 Tanabe et al. ................ 455/1

FOREIGN PATENT DOCUMENTS

| JP | 2004-173249 | 6/2004 |
|----|-------------|--------|
| JP | 2004-266351 | 9/2004 |
| JP | 2005-528842 | 9/2005 |
| JP | 2006-140911 | 6/2006 |
| WO | 03/103162   | 12/2003 |

OTHER PUBLICATIONS

International Search Report (PCT/ISA/220), PCT/JP2007/062498, mailed Aug. 21, 2007, 3 pp.

* cited by examiner

*Primary Examiner*—Edward Urban
*Assistant Examiner*—Junpeng Chen
(74) *Attorney, Agent, or Firm*—Wenderoth, Lind & Ponack, L.L.P.

(57) ABSTRACT

A transmission circuit operates with high efficiency and low distortion. An amplitude and phase extraction section extracts amplitude data and phase data from input data. A phase modulation section phase-modulates the phase data to output a resultant signal as a phase-modulated signal. An amplifier section amplifies the phase-modulated signal to output a resultant signal as a transmission signal. An amplitude control section supplies, to the amplifier section, a voltage controlled in accordance with an AC component represented by a fluctuation component of the amplitude data and a DC component represented by an average value level of the fluctuation component of the amplitude data.

6 Claims, 7 Drawing Sheets

TRANSMISSION CIRCUIT AND COMMUNICATION DEVICE

BACKGROUND OF THE INVENTION

1. Field of the Invention

The present invention relates to a transmission circuit used for communication devices such as mobile phones and wireless LAN devices, and particularly to a transmission circuit, which operates with high efficiency and low distortion, and a communication device using the transmission circuit.

2. Description of the Background Art

Communication devices such as mobile phones and wireless LAN devices are required to secure linearity of a transmission signal over a wide output level range and also to operate with low power consumption. For such a communication device, a transmission circuit which operates with high efficiency and low distortion is used. Hereinafter, conventional transmission circuits will be described.

One of the conventional transmission circuits is, for example, a transmission circuit which uses a modulation method such as a quadrature modulation method to generate a transmission signal (hereinafter, referred to as a quadrature modulation circuit). Since the quadrature modulation circuit is well known, the description thereof will be omitted. A conventional transmission circuit capable of outputting, more efficiently than the quadrature modulation circuit, a transmission signal having high linearity is, for example, a transmission circuit disclosed in FIG. 9 of Japanese Laid-Open Patent Publication No. 2004-266351 (hereinafter, referred to as Patent Document 1). FIG. 7 is a block diagram showing an exemplary configuration of a conventional transmission circuit 90 disclosed in Patent Document 1. In FIG. 7, the conventional transmission circuit 90 comprises an amplitude and phase extraction section 91, phase modulation section 92, amplifier section 93, output terminal 94 and an amplitude control section 95.

The amplitude and phase extraction section 91 extracts amplitude data and phase data from input data. The amplitude data is inputted to the amplitude control section 95. The amplitude control section 95 supplies a voltage to the amplifier section 93 in accordance with the amplitude data. The phase data is inputted to the phase modulation section 92. The phase modulation section 92 performs phase modulation on the inputted phase data to output a resultant signal as a phase-modulated signal. The phase-modulated signal is inputted to the amplifier section 93. The amplifier section 93 amplifies the phase-modulated signal in accordance with the voltage supplied from the amplitude control section 95. The signal amplified by the amplifier section 93 is outputted from the output terminal 94 as a transmission signal. The transmission circuit 90 which operates in the above manner is called a polar modulation circuit.

The conventional transmission circuit 90 has a problem that in the case where an output level of the transmission signal is varied over a wide range, the linearity of the transmission signal is not always secured. For example, in the case where the conventional transmission circuit 90 is applied to the UMTS specifications, the transmission circuit 90 is required to vary the output level over a range of 75 dB which is wider than the case where the transmission circuit is applied to GSM/EDGE specifications. In such a case, the amplitude control section 95 of the transmission circuit 90 is required to greatly vary the voltage to be supplied to the amplifier section 93. However, since a DC bias voltage, which causes internal elements of the amplitude control section 95 to operate, cannot be freely set in the transmission circuit 90, it is difficult to secure the linearity of the amplitude control section 95 when the DC bias voltage is near VCC or GND potential. For this reason, the conventional transmission circuit 90 cannot always secure the linearity of the transmission signal in the case where the output level of the transmission signal is varied over a wide range.

SUMMARY OF THE INVENTION

Therefore, an object of the present invention is to solve the above-mentioned problem and to provide a transmission circuit, which is capable of operating over a wide output level range with high efficiency and low distortion, and a communication apparatus using the transmission circuit.

The present invention is directed to a transmission circuit for generating and outputting a transmission signal based on input data. In order to achieve the object mentioned above, the transmission circuit of the present invention comprises: an amplitude and phase extraction section for extracting amplitude data and phase data from the input data; a phase modulation section for phase-modulating the phase data to output a resultant signal as a phase-modulated signal; an amplifier section for amplifying the phase-modulated signal to output a resultant signal as the transmission signal; and an amplitude control section for supplying, to the amplifier section, a voltage controlled in accordance with the amplitude data. The amplitude control section supplies, to the amplifier section, the voltage controlled in accordance with an AC component, which is represented by a fluctuation component of the amplitude data, and a DC component, which is represented by an average value level of the fluctuation component of the amplitude data.

Preferably, the amplitude control section includes: an AC component control section for outputting a signal corresponding to the AC component represented by the fluctuation component of the amplitude data; a DC component control section for outputting a signal corresponding to the DC component represented by the average value level of the fluctuation component of the amplitude data; and a voltage supply section for adding the signal outputted from the AC component control section and the signal outputted from the DC component control section, and supplying, to the amplifier section, a voltage controlled in accordance with the added signal.

Electric power information, which indicates a magnitude of an output power of the transmission circuit, is inputted to the AC component control section. The AC component control section has: a DA converter for converting the amplitude data into an analogue signal, and outputting the analogue signal as an amplitude signal; a low-pass filter for removing a spurious component from the amplitude signal outputted from the DA converter; and a variable gain amplifier for amplifying or attenuating, by a gain corresponding to the magnitude of the output power indicated by the electric power information, the amplitude signal outputted from the low-pass filter, and outputting a resultant signal as a signal corresponding to the AC component of the amplitude data.

Electric power information, which indicates a magnitude of an output power of the transmission circuit, is inputted to the DC component control section. The DC component control section has: a DC component detection section for detecting, as the DC component of the amplitude data, the average value level of the fluctuation component of the amplitude data, multiplying the detected DC component of the amplitude data by a value indicated by the electric power information, and outputting a resultant signal; and a DA converter for converting the signal outputted from the DC component detection section to an analogue signal, and outputting the analogue signal as a signal corresponding to the DC component of the amplitude data.

Preferably, the amplitude data is inputted, as differential amplitude data, to the DC component detection section, and the DC component detection section adds up the differential amplitude data, divides the added-up differential amplitude data by 2 to detect the average value level of the amplitude data, and uses the detected average value level as the DC component of the amplitude data.

The DC component detection section may: use a digital LPF, which passes only the DC component of the amplitude data, so as to block the AC component of the amplitude data; detect the passed DC component as the average value level of the amplitude data; and use the detected average value level as the DC component of the amplitude data.

The DC component control section may further have an offset correction section for adding a predetermined offset value to the signal outputted from the DC component detection section, thereby correcting an offset occurring in the amplifier section.

Preferably, the voltage supply section has: a power supply section for outputting a voltage corresponding to the signal outputted from the AC component control section; and an adder for adding the voltage outputted from the power supply section and a voltage corresponding to the signal outputted from the DC component control section, and supplying, to the amplifier section, the added voltage.

The voltage supply section may use a differential amplifier to add the signal outputted from the AC component control section and the signal outputted from the DC component control section, and supply, to the amplifier section, a voltage controlled in accordance with the added signal.

The voltage supply section may have an error detection amplifier for realizing a negative feedback of the differential amplifier, and correcting an offset occurring in the differential amplifier.

The present invention is also directed to a communication device having the above-described transmission circuit. The communication device comprises: the transmission circuit for generating a transmission signal; and an antenna for outputting the transmission signal generated by the transmission circuit. The communication device may further comprise: a reception circuit for processing a reception signal received from the antenna; and an antenna duplexer for outputting the transmission signal generated by the transmission circuit to the antenna, and outputting the reception signal received from the antenna to the reception circuit.

As described above, in the present invention, the amplitude control section supplies, to the amplifier section, a voltage controlled in accordance with the AC component, which is represented by the fluctuation component of the amplitude data, and the DC component, which is represented by the average value level of the fluctuation component of the amplitude data. This allows a DC bias voltage, which causes internal elements of the amplitude control section to operate, to be freely set. As a result, the transmission circuit is able to, regardless of an output level of the transmission signal, cause the internal elements of the amplitude control section to operate within a region having favorable linearity. Further, since the transmission circuit can cause the internal elements of the amplitude control section to operate within the region having favorable linearity, there is no necessity to enlarge a size of the internal elements of the amplitude control section and to increase power consumption thereof. Consequently, the transmission circuit is allowed to operate over a wide output level range with high efficiency and low distortion.

Further, the communication device of the present invention is able to, by using the above-described transmission circuit, secure linearity of the transmission signal over a wide power amplification range, and reduce power consumption.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
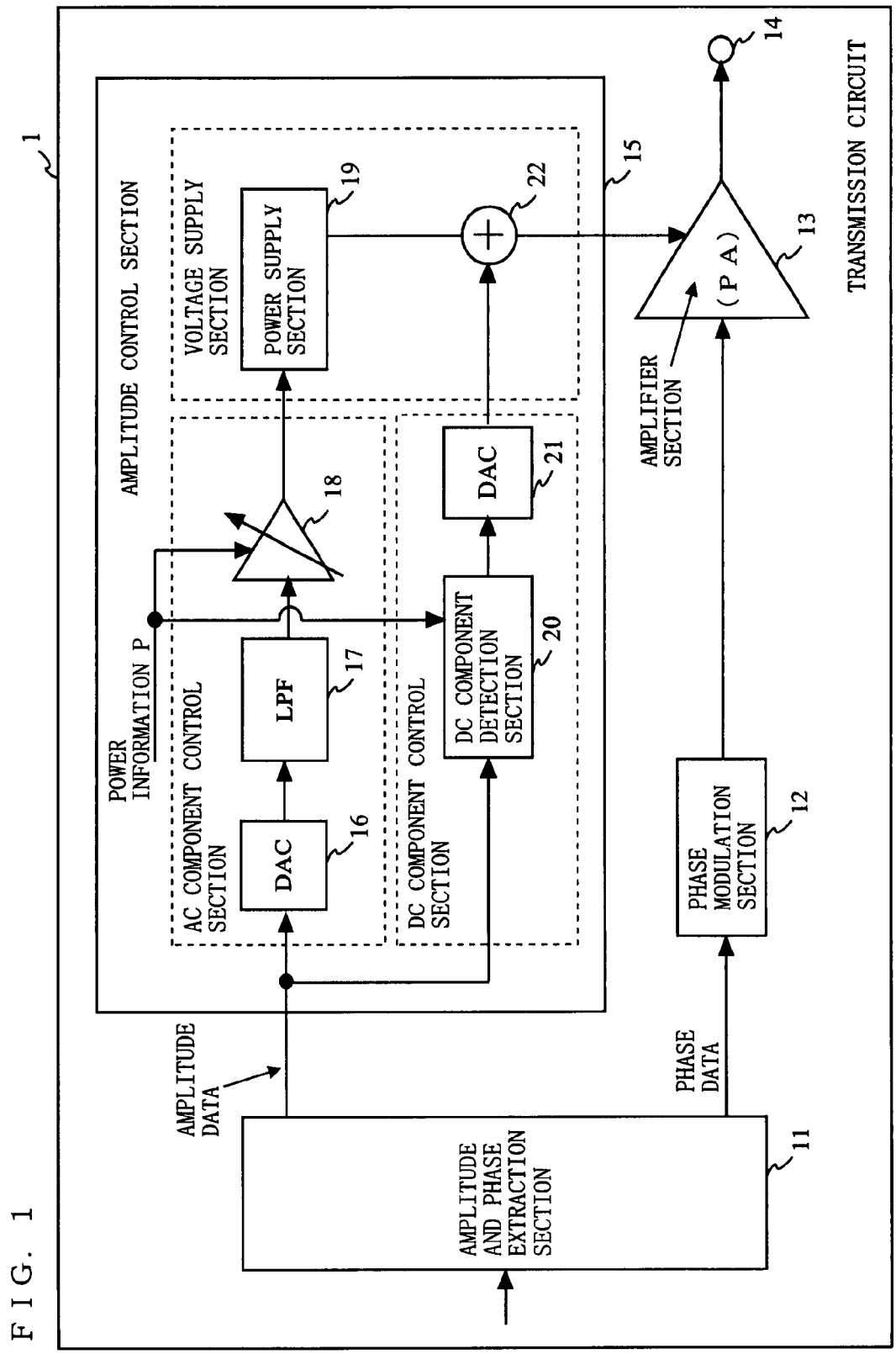
FIG. 1 is a block diagram showing an exemplary configuration of a transmission circuit 1 according to a first embodiment of the present invention.

FIG. 1 is a block diagram showing an exemplary configuration of a transmission circuit 1 according to a first embodiment of the present invention. As shown in FIG. 1, the transmission circuit 1 comprises an amplitude and phase extraction section 11, phase modulation section 12, amplifier section 13, output terminal 14 and an amplitude control section 15. The amplitude control section 15 includes an AC component control section, DC component control section and a voltage supply section. The AC component control section has a digital-analogue converter (DAC) 16, low-pass filter (LPF) 17 and a variable gain amplifier 18. The DC component control section includes a DC component detection section 20 and a digital-analogue converter (DAC) 21. The voltage supply section has a power supply section 19 and an adder 22.

To the amplitude and phase extraction section 11, modulation data is inputted (hereinafter, referred to as input data) as data to be transmitted. The amplitude and phase extraction section 11 extracts, from the input data, an amplitude component and phase component which are digital data, and outputs these components as amplitude data and phase data. The amplitude data is inputted to the amplitude control section 15. The amplitude control section 15 supplies, to the amplifier section 13, a voltage controlled in accordance with the amplitude data. The amplitude control section 15 will be described later in detail. The phase data is inputted to the phase modulation section 12. The phase modulation section 12 performs phase modulation on the inputted phase data, and outputs a resultant signal as a phase-modulated signal. The phase-modulated signal is inputted to the amplifier section 13. The amplifier section 13 amplifies the phase-modulated signal in accordance with the voltage supplied from the amplitude control section 15. The signal amplified by the amplifier section 13 is outputted as a transmission signal from the output terminal 14.

Next, the amplitude control section 15 will be described in detail. In the amplitude control section 15, the amplitude data is inputted to the AC component control section and DC component control section. The AC component control section outputs a signal in accordance with an AC component represented by a fluctuation component of the amplitude data. To be specific, in the AC component control section, the DAC 16 converts the inputted amplitude data to an analogue signal, and outputs the analogue signal as an amplitude signal. The LPF 17 removes a spurious component from the amplitude signal outputted from the DAC 16. The amplitude signal outputted from the LPF 17 is inputted to the variable gain amplifier 18. Further, electric power information P, which indicates magnitude of an output power of the transmission circuit 1, is inputted to the variable gain amplifier 18. The power information P is generated by a digital baseband, based on information from a base station. The variable gain amplifier 18 amplifies or attenuates the inputted amplitude signal by a gain corresponding to the magnitude of the output power of the transmission circuit 1, which magnitude is indicated by the power information P. A signal outputted by the variable gain amplifier is inputted to the voltage supply section as a signal corresponding to the AC component of the amplitude data.

The DC component control section outputs a signal in accordance with a DC component represented by an average value level of the fluctuation component of the amplitude data. To be specific, the amplitude data and the power information P indicating the magnitude of the output power of the transmission circuit 1 are inputted to the DC component detection section 20 in the DC component control section. The DC component detection section 20 detects, at predetermined intervals, the average value level of the inputted amplitude data (i.e., DC component), and multiplies the detected average value level by a value indicated by the power information P, and then outputs a resultant signal. The signal outputted by the DC component detection section 20 is converted to an analogue signal by the DAC 21, and then inputted to the voltage supply section as a signal corresponding to the DC component of the amplitude data.

Hereinafter, a manner in which the DC component detection section 20 detects the average value level of the amplitude data will be described in detail. The DC component detection section 20 uses a first method as shown in FIG. 2A or a second method as shown in FIG. 2B, thereby detecting the average value level of the amplitude data.

Figure 2A:
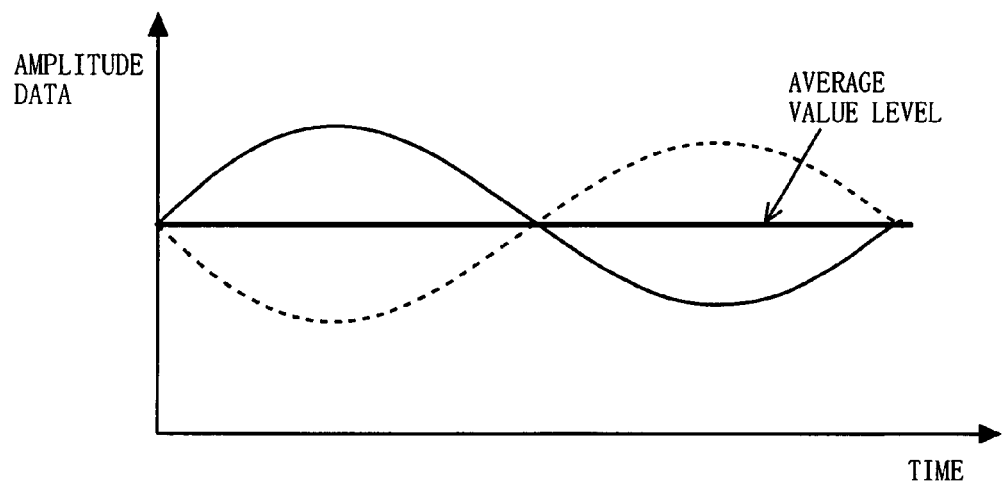
FIG. 2A is a diagram for describing a first method for detecting an average value level of amplitude data.

FIG. 2A is a diagram for describing the first method for detecting the average value level of the amplitude data. As shown in FIG. 2A, the amplitude data is inputted as differential amplitude data to the DC component detection section 20, and at predetermined time intervals, the DC component detection section 20 adds up the differential amplitude data and divides the added-up differential amplitude data by 2 (i.e., averaging), thereby detecting the average value level of the amplitude data at the predetermined time intervals. Here, a time interval for detecting the average value level of the amplitude data is desired to be a time interval for controlling the output power of the transmission circuit 1 (e.g., a slot time interval).

Figure 2B:
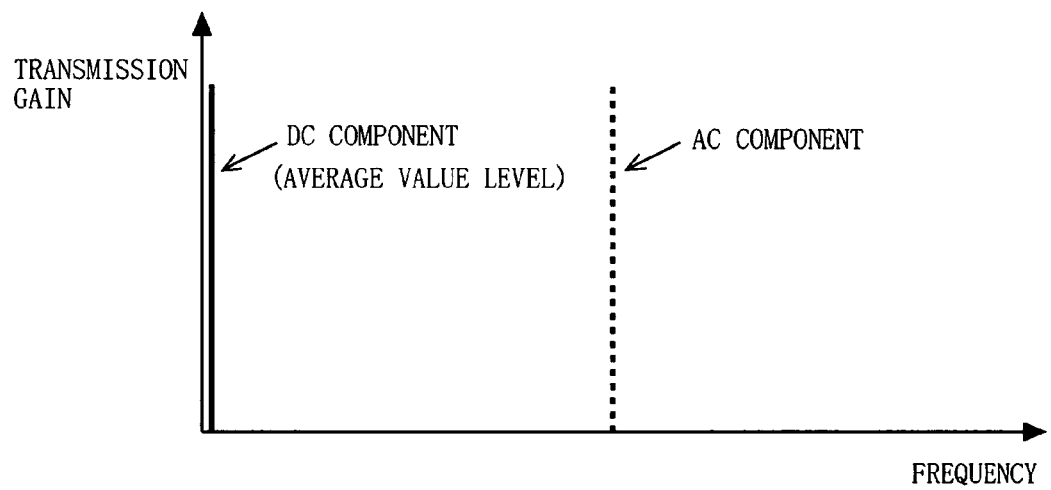
FIG. 2B is a diagram for describing a second method for detecting the average value level of the amplitude data.

FIG. 2B is a diagram for describing the second method for detecting the average value level of the amplitude data. As shown in FIG. 2B, the DC component detection section 20 uses a digital LPF, which only allows a low frequency component (i.e., DC component) to pass, so as to block the AC component of the amplitude data and output the DC component, which passes the digital LPF, as the average value level of the amplitude data. Note that, a particular amount of time is necessary before the digital LPF outputs a correct DC component. This particular amount of time depends on, e.g., an order, scale and operation clock of the circuit. For example, in GSM/EDGE and UMTS specifications, the DC component to be outputted is required to be converged to a desired value within approximately 30 μsec.

The signal outputted from the AC component control section and the signal outputted from the DC component control section are inputted to the voltage supply section. The voltage supply section supplies, to the amplifier section 13, a voltage which is controlled in accordance with the signals respectively outputted from the AC component control section and DC component control section. As a specific example, in the voltage supply section, the power supply section 19 outputs a voltage corresponding to the signal outputted from the AC component control section, and the adder 22 adds the voltage outputted from the power supply section 19 to the voltage outputted from the DC component control section. Then the voltage supply section supplies the added voltage to the amplifier section 13.

Figure 3A:
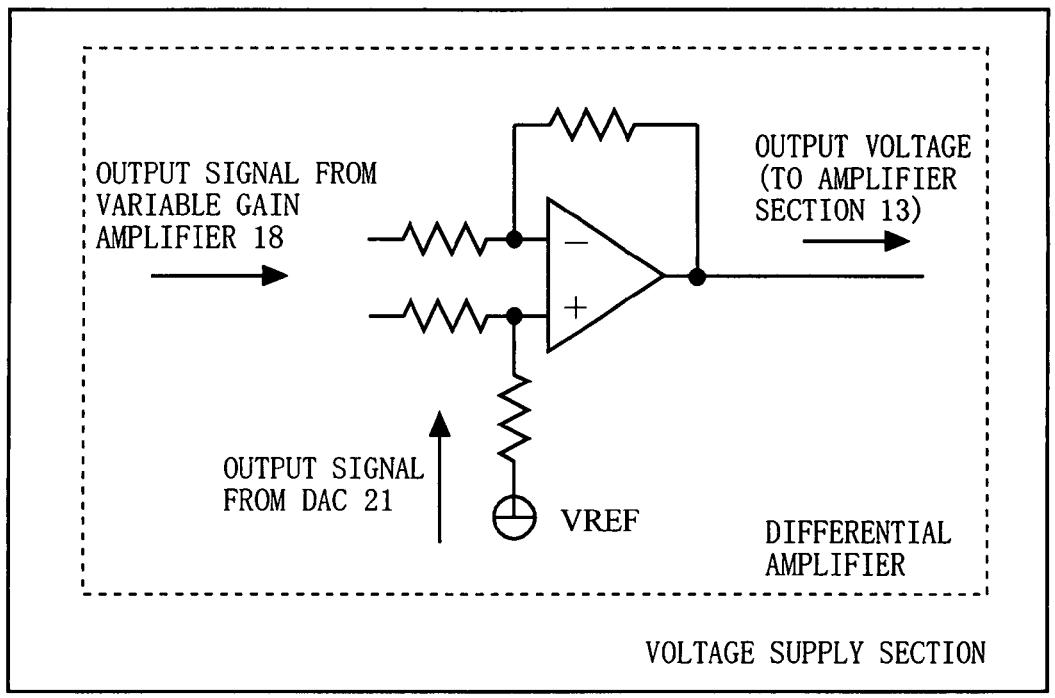
FIG. 3A is a circuit diagram showing an exemplary configuration of a voltage supply section.
Figure 3B:
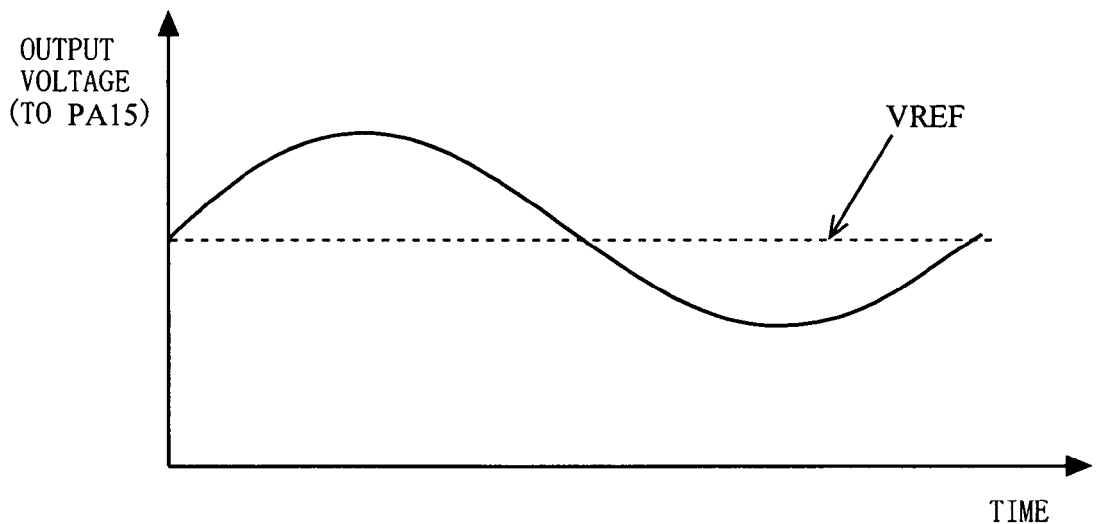
FIG. 3B shows an exemplary waveform of a voltage outputted from the voltage supply section shown in FIG. 3A.

Note that, the voltage supply section may be structured by such a differential amplifier as shown in FIG. 3A. FIG. 3A is a circuit diagram showing an exemplary configuration of the voltage supply section. As shown in FIG. 3A, a signal corresponding to the AC component of the amplitude data is inputted from the AC component control section (variable gain amplifier 18) to input terminals of the voltage supply section. Also, a signal corresponding to the DC component of the amplitude data is inputted, as VREF, from the DC component control section (DAC 21) to an input terminal at a plus side of the voltage supply section. FIG. 3B shows an exemplary waveform of the voltage outputted by the voltage supply section shown in FIG. 3A. As shown in FIG. 3B, the voltage supply section supplies, to the amplifier section 13, the voltage fluctuating positively and negatively from VRFE.

As described above, in the transmission circuit 1 according to the first embodiment of the present invention, the amplitude control section 15 supplies, to the amplifier section 13, a voltage controlled in accordance with the AC component represented by the fluctuation component of the amplitude data and a voltage controlled in accordance with the DC component represented by the average value level of the fluctuation component of the amplitude data. For this reason, the DC bias voltage, which causes the internal elements of the amplitude control section 15 to operate, can be freely set. As a result, the transmission circuit 1 is able to, regardless of the output level of the transmission signal, cause the internal elements of the amplitude control section 15 to operate within a region having favorable linearity. Further, since the transmission circuit 1 can cause the internal elements of the amplitude control section 15 to operate within the region having favorable linearity, there is no necessity to enlarge a size of the internal elements of the amplitude control section 15 and to increase power consumption thereof. Consequently, the transmission circuit 1 is allowed to operate over a wide output level range with high efficiency and low distortion.

Second Embodiment

Figure 4:
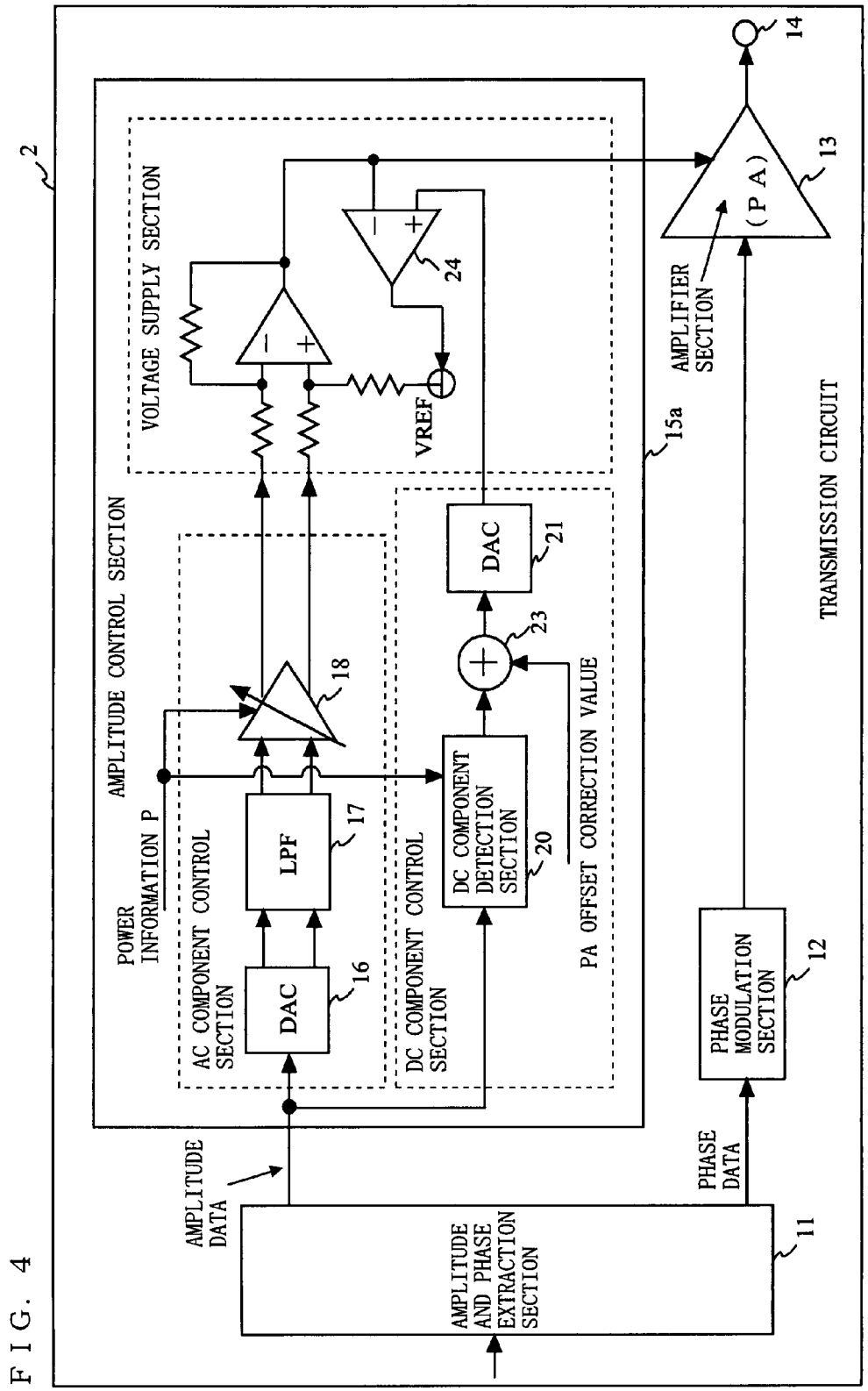
FIG. 4 is a block diagram showing an exemplary configuration of a transmission circuit 2 according to a second embodiment of the present invention.

FIG. 4 is a block diagram showing an exemplary configuration of a transmission circuit 2 according to a second embodiment of the present invention. As shown in FIG. 4, a configuration of the amplitude control section 15a of the transmission circuit 2 is different from that of the amplitude control section 15 of the transmission circuit 1 of the first embodiment. To be specific, in the amplitude control section 15a, the DC component control section further has an offset correction section 23. Moreover, the voltage supply section has a configuration which is a result of adding an error detection amplifier 24 to the circuit configuration of the voltage supply section (differential amplifier) shown in FIG. 3A.

In the DC component control section, a PA offset correction value is inputted to the offset correction section 23. The offset correction section 23 adds the PA offset correction value to a signal outputted from the DC component detection section 20, thereby correcting a DC offset occurring in the amplifier section (PA) 13. The PA offset correction value is set, at factory setting or when the power is turned on, to a most appropriate value for correcting the DC offset occurring in the amplifier section 13. Here, the offset correction section 23 may be connected precedent to the DC component detection section 20. In the voltage supply section, the error detection amplifier realizes negative feedback of the differential amplifier, and corrects the DC offset occurring in the voltage supply section (differential amplifier).

As described above, the transmission circuit 2 according to the second embodiment of the present invention is capable of correcting the DC offset occurring in the amplifier section 13 and the DC offset occurring in the voltage supply section. As a result, the transmission signal having higher linearity is outputted.

Figure 5:
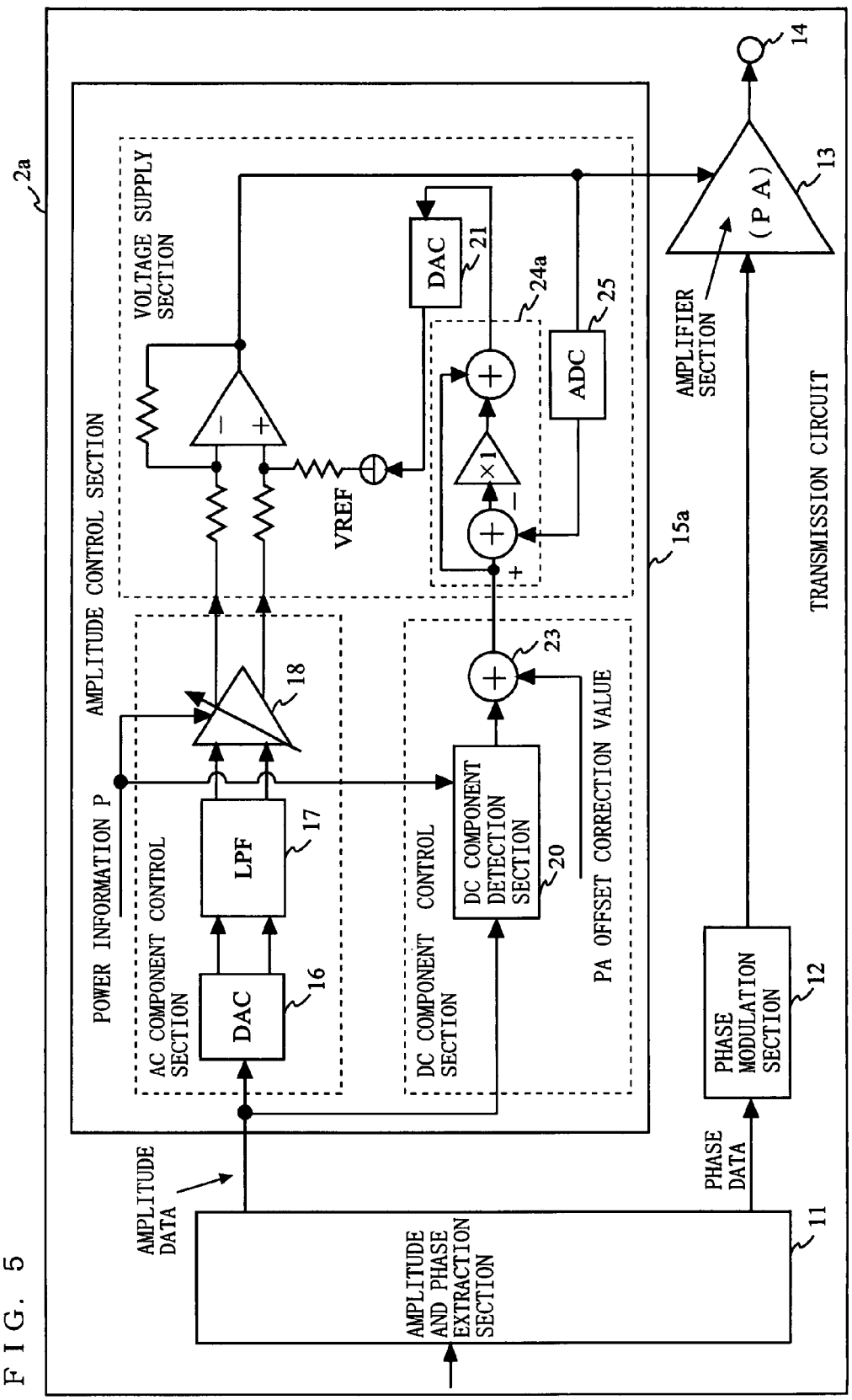
FIG. 5 is a block diagram showing an example of a transmission circuit 2a in which an error detection amplifier is structured by digital components.

Although the error detection amplifier 24 in the above-described transmission circuit 2 is structured by analogue components, the error detection amplifier 24 may be structure by digital components. FIG. 5 is a block diagram showing an example of a transmission circuit 2a whose error detection amplifier is structured by digital components. In FIG. 5, the transmission circuit 2a has, between the offset correction section 23 and DAC 21, an error detection amplifier 24a structured by digital components. A voltage, which is converted by an AD converter 25 into a digital signal, is fed back to the error detection amplifier 24a. Even in the case where the error detection amplifier 24a is structured by digital components, the transmission circuit 2a can provide the same effects as those of the above-described transmission circuit 2.

Third Embodiment

Figure 6:
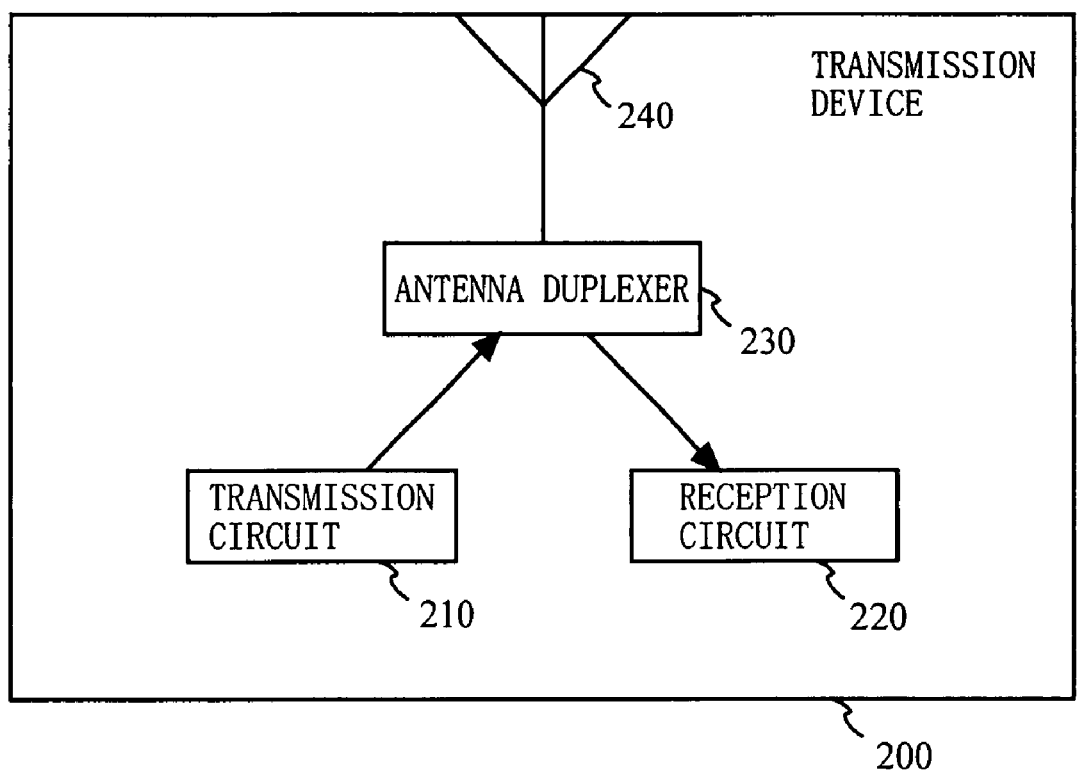
FIG. 6 is a block diagram showing an exemplary configuration of a communication device according to a third embodiment of the present invention.
Figure 7:
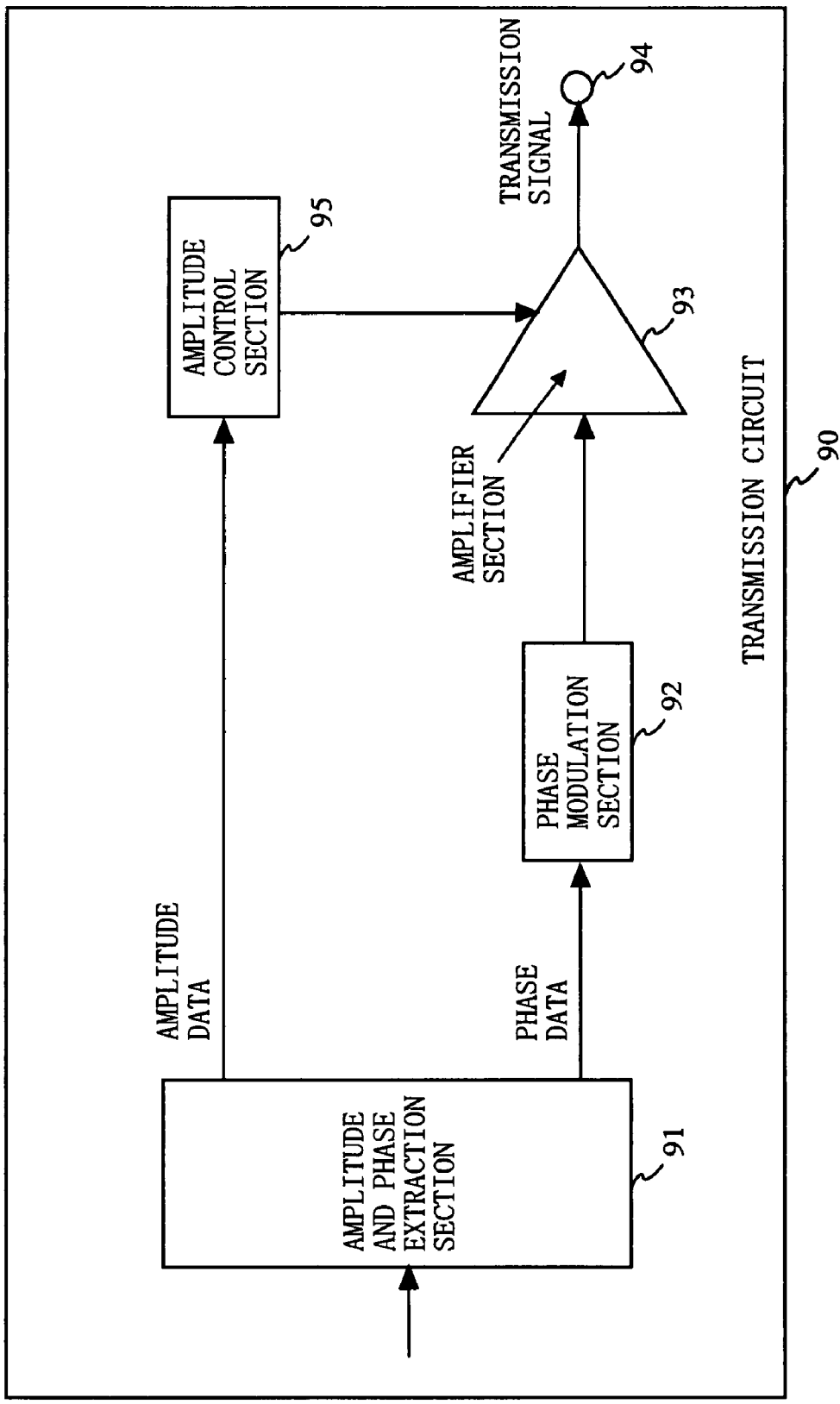
FIG. 7 is a block diagram showing an exemplary configuration of a conventional transmission circuit 90.

FIG. 6 is a block diagram showing an exemplary configuration of a communication device according to a third embodiment of the present invention. As shown in FIG. 6, a communication device 200 according to the third embodiment comprises a transmission circuit 210, reception circuit 220, antenna duplexer section 230 and an antenna 240. The transmission circuit 210 is any one of the transmission circuits described in the above first and second embodiments. The antenna duplexer section 230 transmits to the antenna 240 a transmission signal outputted from the transmission circuit 210, and prevents the transmission signal from leaking to the reception circuit 220. Also, the antenna duplexer section 230 transmits to the reception circuit 220 a reception signal inputted from the antenna 240, and prevents the reception signal from leaking to the transmission circuit 210.

Accordingly, the transmission signal is outputted from the transmission circuit 210, and released from the antenna 240 to the exterior space via the antenna duplexer section 230. The reception signal is received by the antenna 240, and then received by the reception circuit 220 via the antenna duplexer section 230. The communication device 200 according to the third embodiment uses any of the transmission circuits according to the first and second embodiments, thereby securing the linearity of the transmission signal and also realizing low distortion of a radio device. Since there is no branching element, such as a directional coupler, on an output of the transmission circuit 210, loss from the transmission circuit 210 to the antenna 240 is reduced, whereby power consumption at the time of transmission is reduced. As a result, the communication device 200 is capable of operating for a long period of time as a radio communication device. Note that, the communication device 200 may have a configuration which includes only the transmission circuit 210 and antenna 240.

The transmission circuit according to the present invention is applicable to communication devices such as mobile phones and wireless LAN devices.

While the invention has been described in detail, the foregoing description is in all aspects illustrative and not restrictive. It is understood that numerous other modifications and variations can be devised without departing from the scope of the invention.

What is claimed is:

1. A transmission circuit for generating and outputting a transmission signal based on input data, the transmission circuit comprising:
    an amplitude and phase extraction section for extracting amplitude data and phase data from the input data;
    a phase modulation section for phase-modulating the phase data to output a resultant signal as a phase-modulated signal;
    an amplifier section for amplifying the phase-modulated signal to output a resultant signal as the transmission signal; and
    an amplitude control section including:
        an AC component control section for outputting a signal corresponding to an AC component, which is represented by a fluctuation component of the amplitude data;
        a DC component control section for outputting a signal corresponding to a DC component, which is represented by an average value level of the fluctuation component of the amplitude data; and
        a voltage supply section for adding the signal outputted from the AC component control section and the signal outputted from the DC component control section, and supplying, to the amplifier section, a voltage controlled in accordance with the added signal, wherein
    the DC component control section receives electric power information that indicates a magnitude of an output power of the transmission circuit, and
    the DC component control section includes:
        a DC component detection section for detecting, as the DC component of the amplitude data, the average value level of the fluctuation component of the amplitude data, multiplying the detected DC component of the amplitude data by a value indicated by the electric power information, and outputting a resultant signal; and
        a DA converter for converting the signal outputted from the DC component detection section to an analog signal, and outputting the analog signal as the signal corresponding to the DC component of the amplitude data.

2. The transmission circuit according to claim 1, wherein the DC component detection section receives the amplitude data as differential amplitude data, adds up the differential amplitude data, divides the added-up amplitude data by 2 to detect the average value level of the amplitude data, and uses the detected average value level as the DC component of the amplitude data.

3. The transmission circuit according to claim 1, wherein
   the DC component detection section includes a digital low pass filter,
   the digital low pass filter passes only the DC component of the amplitude data and blocks the AC component of the amplitude data, and
   the DC component detection section detects the passed DC component as the average value level of the amplitude data, and uses the detected average value level as the DC component of the amplitude data.

4. The transmission circuit according to claim 1, wherein the DC component control section further includes an offset correction section for adding a predetermined offset value to the signal outputted from the DC component detection section, thereby correcting an offset occurring in the amplifier section.

5. A communication device comprising:
   a transmission circuit for generating a transmission signal; and
   an antenna for outputting the transmission signal generated by the transmission circuit, wherein
   the transmission circuit is the transmission circuit according to claim 1.

6. The communication device according to claim 5, further comprising:
   a reception circuit for processing a reception signal received from the antenna; and
   an antenna duplexer for outputting the transmission signal generated by the transmission circuit to the antenna, and outputting the reception signal received from the antenna to the reception circuit.

* * * * *